United States Patent [19]

Hashimoto

[11] Patent Number: 5,329,488
[45] Date of Patent: Jul. 12, 1994

[54] NONVOLATILE SEMICONDUCTOR MEMORY DEVICE WITH REDUNDANCY CIRCUIT

[75] Inventor: Kiyokazu Hashimoto, Tokyo, Japan
[73] Assignee: Nec Corporation, Japan
[21] Appl. No.: 985,607
[22] Filed: Dec. 3, 1992

[30] Foreign Application Priority Data

Dec. 27, 1991 [JP] Japan .................................. 3-359812

[51] Int. Cl.⁵ ........................ G11C 11/40; G11C 5/02
[52] U.S. Cl. .................. 365/200; 365/189.08; 365/230.03
[58] Field of Search .............. 365/200, 230.03, 189.08

[56] References Cited

U.S. PATENT DOCUMENTS

| | | | |
|---|---|---|---|
| 4,365,319 | 12/1982 | Takemae | 365/200 |
| 4,547,867 | 10/1985 | Reese | 365/200 |
| 4,727,516 | 2/1988 | Yoshida | 365/200 |
| 4,881,200 | 11/1989 | Urai | 365/200 |
| 4,885,720 | 12/1989 | Miller | 365/200 |
| 5,278,794 | 1/1994 | Tanaka | 365/200 |

OTHER PUBLICATIONS

IBM Technical Disclosure Bulletin vol. 19 No. 5 Oct. 1976.

Primary Examiner—William L. Sikes
Assistant Examiner—Tiep Nguyen
Attorney, Agent, or Firm—Laff, Whitesel, Conte, Saret

[57] ABSTRACT

A nonvolatile semiconductor memory device for use as a flash EEPROM includes a plurality of sectors each comprising a plurality of main memory cell regions each composed of a matrix of nonvolatile memory cells and at least one redundant memory cell region composed of a matrix of nonvolatile memory cells. When one of said nonvolatile memory cells in any one of the sectors is found defective and is selected by addressing, it is replaced with one of the nonvolatile memory cells in the redundant memory cell region.

7 Claims, 6 Drawing Sheets

NONVOLATILE SEMICONDUCTOR MEMORY DEVICE WITH REDUNDANCY CIRCUIT

BACKGROUND OF THE INVENTION

1. Field of the Invention

The present invention relates to a semiconductor memory device, and more particularly to a nonvolatile semiconductor memory device known as EEPROM (electrically erasable programmable read-only memory).

2. Description of the Prior Art

FIG. 1 of the accompanying drawings shows, in block form, memory cells and associated circuit components of a flash EEPROM which can erase all data stored in memory cells at one time. The circuit arrangement shown in FIG. 1 corresponds to one bit of an output signal. If the flash EEPROM is of an 8-bit output configuration, it has eight circuits each identical to that shown in FIG. 1 which are arranged parallel to each other.

The flash EEPROM has terminals PP connected to an external voltage supply Vpp for supplying the high voltage required when the EEPROM writes or erases data. The flash EEPROM also has a plurality of column address lines $Y_{11}, \ldots, Y_1, Y_{s21}, \ldots, Y_{s2j}$ for indicating the row address of a memory cell, and a plurality of row address lines $X_1, \ldots, X_k$ for indicating the row address of a memory cell. In write mode, a data input line $D_{IN}$ supplies a memory cell which has been selected by a column address line and row address line with data "0" that indicates a high voltage of VPG for actually writing data, or with data "1" that indicates a voltage of 0 V for writing no data. A signal ER is of a high level "H" in erase mode and of a low level "L" in other modes.

An N-channel enhancement MOSFET (hereinafter referred to as "NE-MOSFET") $Q_{\gamma_1 W}$ for writing data has a gate controlled by the data input line $D_{IN}$. The flash EEPROM also includes a plurality of NE-MOSFETs $Q_{YS211}, \ldots, Q_{YS21j}, Q_{\gamma_{111}}, \ldots, Q_{\gamma_{1h}}, \ldots, Q_{\gamma_{njl}}$ for selecting row addresses. Memory cells $M_{1111}, \ldots, M_{lk1l}$ have respective drains connected in common to a digit line $D_{11l}$, respective sources connected in common to a common source terminal CS, and respective gates connected respectively to the row address lines $X_1, \ldots, X_k$. Memory cells $M_{1111}, \ldots, M_{1k11}$ have respective drains connected in common to a digit line $D_{111}$, respective sources connected in common to the common source terminal CS, and respective gates connected respectively to the row address lines $X_1, \ldots, X_k$. Memory cells $M_{11jl}, \ldots, M_{1kjl}$ have respective drains connected in common to a digit line $D_{1jl}$, respective sources connected in common to the common source terminal CS, and respective gates connected respectively to the row address lines $X_1, \ldots, X_k$. Memory cells $M_{11jl}, \ldots, M_{1kjl}$ have respective drains connected in common to a digit line $D_{1jl}$, respective sources connected in common to the common source terminal CS, and respective gates connected respectively to the row address lines $X_1, \ldots, X_k$. The memory cells $M_{111l}, \ldots, M_{1k1l}, M_{111l}, \ldots, M_{1k1l}$ are arranged as a memory cell matrix $MX_{1l}$ having an output node $N_{1l}$, and the memory cells $M_{11jl}, \ldots, M_{1kjl}, M_{11jl}, \ldots, M_{1kjl}$ are arranged as a memory cell matrix $MX_{1j}$ having an output node $N_{1j}$.

In read mode, a sensing amplifier SA1 serves to detect whether a memory cell which has been selected by a row address line and a column address line stores "0" (i.e., the memory cell has written data) or "1" (i.e., the memory cell has no written data or has erased data). The sensing amplifier SA1 can amplify a change in the voltage at a data bus $SC_1$. The sensing amplifier SA1 produces an output signal $S_{out1}$ indicative of the detected result. A source switch SS applies a voltage of 0 V to the common source terminal CS in write and read modes, and an erase voltage $V_{pp}$ to the common source terminal CS in erase mode.

The following table shows voltages at the signal lines and nodes at the time the memory cell $M_{1111}$ is selected by row and column address lines in write, erase, and read modes:

| Node Mode | PP | $X_1$ | $Y_{11}$ | $YS_{21}$ ($Y_{21}$) | $D_{IN}$ | $D_{111}$ | CS |
|---|---|---|---|---|---|---|---|
| Data "0" Write | 12 V | 12 V | 12 V | 12 V | VPG | VPG - VTN | 0 V |
| Date "1" Erase | 12 V | 0 V | 0 V | 0 V | 0 V | Floating | 12 V |
| Read | 5 V | 5 V | 5 V | 5 V | 0 V | 1.5 V | 0 V |

Operation of the flash EEPROM in the above three modes will be briefly described below with reference to FIG. 1 and the above table.

(1) Write mode

A voltage Vpp of 12 V is applied to the terminals PP, a voltage of 12 V to the row address line $X_1$, a voltage of 0 V to the other unselected row address lines, a voltage of 12 V to the column address lines $Y_{11}, Y_{S21}$, a voltage of 0 V to the other unselected column address lines, and a voltage of 0 V to the common source line CS.

When the data to be written is "0," the high voltage VPG which is determined according to the writing characteristics of the memory cells (VPG<Vpp) is applied to the data input line $D_{IN}$. The voltage [VPG−VTN] (VTN is the threshold voltage of all the NE-MOSFETs) is applied to the drain of the memory cell $M_{111l}$ over the digit line $D_{111}$, the voltage Vpp = 12 V to the gate thereof, and the voltage of 0 V to the source thereof. Therefore, a channel current flows through the memory cell $M_{111l}$ injecting hot electrons into a floating gate $FG_{111l}$ of the memory cell $M_{111l}$. As a result, the threshold voltage of the memory cell $M_{111l}$ increases to a value higher than its reading voltage of 5 V.

When the data to be written is "1," a voltage of 0 V is applied to the data input line $D_{IN}$, rendering the NE-MOSFET $Q_{\gamma_1 W}$ nonconductive, and no high voltage is applied to the drain of the memory cell $M_{111l}$ over the digit line $D_{111}$. Therefore, no data is written in the memory cell $M_{111l}$.

(2) Erase mode

A voltage Vpp of 12 V is applied to the terminal PP, and a voltage of 0 V is applied to all the column address lines and all the row address lines. When the signal ER supplied to the source switch SS is of a high level ("H"), the voltage applied to the common source line CS rises from 0 V to Vpp and is balanced at Vpp. Since the common source line CS is shared by the sources of all the memory cells $M_{111l}$–$M_{1kjl}$, a high electric field is applied between the gates and sources of all the memory cells $M_{111l}$–$M_{1kjl}$. Electric charges stored in the floating gates of the memory cells $M_{111l}$–$M_{1kjl}$ are discharged into the common source line CS. The threshold voltage of all the memory cells $M_{111l}$–$M_{1kjl}$ is lowered, and the reading voltage thereof is also lowered.

(3) Read mode

A voltage VCC of 5 V is applied to the terminal PP, a voltage of 5 V to the row address line $X_1$, a voltage of 0 V to the other unselected row address lines, a voltage of 5 V to the column address lines $Y_{11}$, $Y_{S21}$, a voltage of 0 V to the other unselected column address lines, and a voltage of 0 V to the common source line CS.

Therefore, the output node $N_{11}$ and the data bus $SC_1$ are connected to each other. If the data "0" is stored in the memory cell $M_{111l}$, the memory cell $M_{111l}$ is rendered nonconductive, and the voltage at the data bus $SC_1$ is balanced at a value of 1.5 V, which is determined by the biasing circuit of the sensing amplifier SA1. The sensing amplifier SA1 produces an output signal $S_{out1}$ of "0".

On the other hand, if the data "1" is stored in the memory cell $M_{111l}$, the memory cell $M_{111l}$ is rendered conductive, and the voltage at the data bus $SC_1$ falls slightly from 1.5 V, which is detected by the sensing amplifier SA1. The sensing amplifier SA1 produces an output signal $S_{out1}$ of "1".

The flash EEPROM operates in write, erase, and read modes in the manner described above.

To meet the demand in recent years for larger-capacity flash EEPROMs, there have been introduced into the market flash EEPROMs which are composed of memory cells grouped into n sectors that are individually programmable and erasable.

Flash EEPROMs composed of memory cells grouped into n sectors are advantageous for the following reasons: If memory cells whose data is to be varied exist in only one sector, the data in the other (n−1) sectors remains intact, and the sector which is composed of the memory cells that store the data to be varied is erased in its entirety at one time, after which desired data may be written successively into those memory cells in the erased sector. Consequently, the time required to write the desired data is shorter than the time needed to write data in a flash EEPROM that is not divided into sectors.

For example, if the memory cells of a 2M-bit flash EEPROM having an 8-bit data output capability are grouped into 16 sectors each having a storage capacity of 128 Kbits (16 Kbytes), data of 128 Kbits can be entirely erased at one time.

EEPROMs of increased storage capacity have problems regarding low yield as they tend to suffer malfunctions of some memory cells due, for example, to chip defects that occur when the EEPROMs are manufactured. It is known that the yield of such EEPROMs can be greatly increased when any defective memory cells are remedied. According to one attempt, a redundant cell region is provided in a chip, and upon detection of a digit line that is connected to a defective memory cell, the digit line and the defective memory cell are replaced with a digit line and a redundant memory cell which are present in the redundant cell region.

FIG. 2 of the accompanying drawings shows, in block form, memory cell matrices of an 8-bit-output flash EEPROM composed of memory cell sectors, each of which can be entirely erased at one time. The flash EEPROM has a plurality of memory cell sectors 1, . . . , n. These memory cell sectors 1, . . . , n comprise memory cell matrices $MX_{11}$, $MX_{12}$, . . . , $MX_{18}$, . . . , $MX_{n1}$, $MX_{n2}$, . . . , $MX_{n8}$ having respective output nodes $N_{11}$, $N_{12}$, . . . , $N_{18}$, . . . , $N_{n1}$, $N_{n2}$, . . . , $N_{n8}$, each of the memory cell matrices being identical in structure to the memory cell matrix $MX_{11}$ shown in FIG. 1. The memory cell sectors 1, . . . , n also include redundant memory cell regions or matrices $MX_{1R}$, . . . , $MX_{nR}$, respectively, having respective output nodes $N_{1R}$, . . . , $N_{nR}$ and redundant memory cell identical in structure to the memory cells $M_{1111}$–$M_{1kjl}$ shown in FIG. 1. The redundant memory cell matrix $MX_{1R}$ and other redundant memory cell matrices, e.g., the redundant memory cell matrix $MX_{nR}$, are structurally identical to the memory cell matrix $MX_{11}$. In the memory cell sector 1, any digit line that is connected to a defective memory cell among the memory cells in the memory cell matrices $MX_{11}$–$MX_{18}$ which cannot write, erase, or read data can be replaced with a digit line in the redundant memory cell matrix $MX_{1R}$. In the other memory cell sectors, e.g., the memory cell sector n, any digit line that is connected to a defective memory cell among the memory cells in the memory cell matrices $MX_{n1}$–$MX_{n8}$ which cannot write, erase, or read data can be replaced with a digit line in the redundant memory cell matrix $MX_{nR}$. Those memory cell matrices other than the redundant memory cell matrices will also be referred to as main memory cell matrices or regions.

A source switch $SS_1$ for sector 1 is connected to a common source line $CS_1$ that is coupled to the sources of all the memory cells in sector 1. The source switch $SS_1$ can be controlled by a source switch selection line $Y_{21(S)}$ and a signal line ER. Likewise, source switches for the other sectors are connected in the same manner as described above. For example, a source switch $SS_n$ for a sector n is connected to a common source line $CS_n$ that is coupled to the sources of all the memory cells in sector n. The source switch $SS_n$ can be controlled by a source switch selection line $Y_{2n(S)}$ and signal line ER.

Data buses $SC_1$, $SC_2$, . . . , $SC_8$ are connected to the source of the data writing NE-MOSFET $Q_{Y1W}$ and input terminals of sensing amplifier SA1, as shown in FIG. 1. Data buses $SC_1$, $SC_2$, . . . , $SC_8$ are also connected through respective sector-selecting NE-MOSFETs $Q_{Y211}$, $Q_{Y212}$, . . . , $Q_{Y218}$, . . . , $Q_{Y2n1}$, $Q_{Y2n2}$, . . . , $Q_{Y2n8}$ to memory cell matrices $MX_{11}$, $MX_{12}$, . . . , $MX_{18}$, . . . , $MX_{n1}$, $MX_{n2}$, . . . , $MX_{n8}$, respectively. Sensing amplifier SA1 produces output signals $S_{out1}$, $S_{out2}$, . . . , $S_{out8}$ respectively with respect to data buses $SC_1$, $SC_2$, . . . , $SC_8$.

A data bus $SC_R$ is connected to the source of the data writing NE-MOSFET $Q_{Y1W}$ and an input terminal of sensing amplifier SA1, as shown in FIG. 1. Data bus $SC_R$ is also connected through sector-selecting NE-MOSFETs $Q_{Y21R}$, . . . , $Q_{Y2nR}$ to redundant memory cell matrices $MX_{1R}$, . . . , $MX_{nR}$, respectively. Sensing amplifier SA1 produces an output signal $S_{outR}$ with respect to data bus $SC_R$.

Sector selection lines $Y_{21}$, . . . , $Y_{2n}$ are connected to the gates of selector-selecting NE-MOSFETs $Q_{Y211}$, $Q_{Y212}$, . . . , $Q_{Y218}$, $Q_{Y21R}$, . . . , $Q_{Y2n1}$, $Q_{Y2n2}$, . . . , $Q_{Y2n8}$, $Q_{Y2nR}$.

The flash EEPROM shown in FIG. 2 differs from the flash EEPROM shown in FIG. 1 in that whereas data is written and read through column-address selecting NE-MOSFET NE-MOSFETs $Q_{YS211}$, . . . , $Q_{YS21j}$ in the write and read modes in the flash EEPROM shown in FIG. 1, data is written and read through sector-selecting NE-MOSFETs $Q_{Y211}, \ldots, Q_{Y2n1}$ in the flash EEPROM shown in FIG. 2. The voltages at the nodes in the write and read modes shown in the above table apply to the flash EEPROM shown in FIG. 2 except that $Y_{S21}$ should change to $Y_{21}$.

Operation of the flash EEPROM shown in FIG. 2 in sector erase mode will be described below.

It is assumed that sector 1 is selected to be erased. Signal line ER is set to a high level ("H"), source switch selection line $Y_{21(S)}$ is set to a high level ("H"), and the other source switch selection lines $Y_{22(S)}$–$Y_{2n(S)}$ are set to a low level ("L"). A voltage of 12 V is then applied to common source line $CS_1$, and a voltage of 0 V is applied to the other common source lines $CS_2$–$CS_n$. Since a voltage of 0 V is applied to all of the column now address lines at this time as shown in the above table, a high electric field is applied between the gates and sources of only the memory cells belonging to sector 1, and the data stored in the memory cells of sector 1 are erased.

While the flash EEPROM shown in FIG. 2 operates in sector erase mode as described above, all the data stored in the flash EEPROM can also be erased when all source switches $SS_1$–$SS_n$ are rendered active.

If it is found that the flash EEPROM shown in FIG. 2 contains a memory cell which is unable to write, erase, or read any data, then the digit line connected to the faulty memory cell can be replaced with a digit line in the redundant memory cell region or matrix.

It is assumed that a digit line $D_{181}$ in memory cell matrix $MX_{18}$ is to be replaced with a digit line $D_{1R1}$ in redundant memory cell matrix $MX_{1R}$ in sector 1. FIG. 3 of the accompanying drawings shows a control circuit $RED_{11}$ for replacing digit lines $D_{111}, D_{121}, \ldots, D_{181}$ in respective main memory cell matrices $MX_{11}, MX_{12}, \ldots, MX_{18}$ with digit line $D_{1R1}$ in redundant memory cell matrix $MX_{IR}$ in sector 1. For the sake of brevity, the number of memory cell sectors used is assumed to be 16.

Control circuit $RED_{11}$ has address input terminals $A_0, A_1, A_2, A_3$ for supplying addresses to select sector selection lines $Y_{2l}, \ldots, Y_{2n}$ shown in FIG. 2. A sector selection decoder Y-DEC-2 is supplied with the address data from address input terminals $A_0, A_1, A_2, A_3$. Redundancy address circuits $RAC_0, RAC_1, RAC_2, RAC_3$ are controlled by the addresses supplied respectively from address input terminals $A_0, A_1, A_2, A_3$. Redundancy address circuits $RAC_0, RAC_1, RAC_2, RAC_3$ each have internal fuses for storing the address of a sector to be replaced. Redundancy address circuits $RAC_0, RAC_1, RAC_2, RAC_3$ detect whether supplied address data agrees with the stored address data, and produce respective output signals $RA_{10}, RA_{11}, RA_{12}, RA_{13}$ when the supplied address data agrees with the stored address data. A redundancy selection circuit RSC stores data indicative of whether the flash EEPROM uses a redundancy memory cell matrix or not. Such data is stored by selectively melting an internal fuse in the redundancy selection circuit RSC with a control signal supplied from an external terminal $D_W$. When a redundancy memory cell matrix is used, the redundancy selection circuit RSC signal $RY_{21}$ of "1".

Redundancy bit circuits $RBC_0, RBC_1, RBC_2$ each have fuses which are selectively melted by control signals supplied from respective input terminals $D_0, D_1, D_2$ so as to store data indicative of which output bit the substituted digital line is to be assigned to.

A redundancy access circuit $RACC_{11}$ produces an output signal $Y_R$ of "1" when the address data supplied from the input terminals $A_0, A_1, A_2, A_3$ agrees with the address data stored in redundancy address circuits $RAC_0, RAC_1, RAC_2, RAC_3$, i.e., when the sector selected by the address data supplied from input terminals $A_0, A_1, A_2, A_3$ agrees with the sector whose memory cell matrix is to be replaced with the redundancy memory cell matrix. Redundancy access circuit $RACC_{11}$ comprises a NAND gate $NAND_R$ and an inverter $INV_R$.

Control circuit $RED_{11}$ also has a control circuit $TR_{11}$ which controls the transfer of the output data of the sensing amplifier that indicates a redundancy memory cell to either one of output signals $D_{out1}$–$D_{out8}$. Circuit $TR_{11}$ comprises a decoder composed of NAND gates $NAND_1$–$NAND_8$ coupled to respective inverters $INV_1$–$INV_8$, and a switching section composed of switches $SW_1$–$SW_8$.

As described above, digit line $D_{181}$ in memory cell matrix $MX_{18}$ is assumed to be replaced with digit line $D_{1R1}$ in redundant memory cell matrix $MX_{1R}$ in sector 1. In a procedure for checking the functions of the flash EEPROM, the address of sector 1 in which digit line $D_{181}$ is to be replaced with digit line $D_{1R1}$ and data representing corresponding output bits are written by fuses. For example, it is assumed that when no data is written by the fuses, output signals "0" are produced. The fuses of redundancy address circuits $RAC_0, RAC_1, RAC_2, RAC_3$ do not write any data provided the address indicative of sector 1 corresponds to $(RA_{10}, RA_{11}, RA_{12}, RA_{13}) = (0, 0, 0, 0)$, and all of the fuses of the redundancy bit circuits $RBC_0, RBC_1, RBC_2$ write data provided data indicative of an output bit 8 corresponds to $(D_0, D_1, D_2) = (1, 1, 1)$.

If the fuses of redundancy bit circuits $RBC_0, RBC_1, RBC_2$ comprise polysilicon fuses, data may be written by melting the fuses with a laser beam or electrically melting the fuses with a high voltage applied to input terminals $D_0, D_1, D_2$.

The fuses may comprise memory cells identical to memory cell $M_{1111}$ shown in FIG. 1 such that data can be electrically written thereby.

Since a redundant memory cell matrix is used, data is also written by the fuse of the redundancy selection circuit RSC.

As described above, it is determined whether or not data is to be written by the fuses in the procedure for checking the functions of the flash EEPROM. In this embodiment, if the data stored by the fuses of redundancy address circuits $RAC_0, RAC_1, RAC_2, RAC_3$ is designated by $RAC_{f0}, RAC_{f1}, RAC_{f2}, RAC_{f3}$, respectively, the stored data is $(RAC_{f0}, RAC_{f1}, RAC_{f2}, RAC_{f3}) = (0, 0, 0, 0)$, respectively.

Inasmuch as the bit for outputting the redundancy memory cell data is an output bit 8, the fuses of redundancy bit circuits $RBC_0, RBC_1, RBC_2$ store data $(RB_{10}, RB_{11}, RB_{12}) = (1, 1, 1)$, respectively. Redundancy bit circuits $RBC_0, RBC_1, RBC_2$ also store signals $BRB_{10}, BRB_{11}, BRB_{12}$, which are an inversion of the data $RB_{10}, RB_{11}, RB_{12}$. Therefore, this inverted data is $(BRB_{10}, BRB_{11}, BRB_{12}) = (0, 0, 0)$. The fuse of redundancy selection circuit RSC stores the data $(RY_2) = (1)$.

The stored data of the fuses is established as described above. In the read mode, when address data $(A_0, A_1, A_2, A_3) = (0, 0, 0, 0)$ is supplied from address input terminals $A_0, A_1, A_2, A_3$, respectively, since the supplied address data $(A_0, A_1, A_2, A_3)$ agrees with the data $RAC_{f0}$, $RAC_{f1}$, $RAC_{f2}$, $RAC_{f3}$ stored by the fuses of redundancy address circuits $RAC_0$, $RAC_1$, $RAC_2$, $RAC_3$, redundancy address circuits $RAC_0$, $RAC_1$, $RAC_2$, $RAC_3$ produce respective output signals ($RA_{10}$, $RA_{11}$, $RA_{12}$, $RA_{13}$) = (1, 1, 1, 1). Therefore, redundancy access circuit $RACC_{11}$ produces an output signal $Y_R$ of "1," activating control circuit $TR_{11}$. Control circuit $TR_{11}$ is supplied with the data ($RB_{10}$, $RB_{11}$, $RB_{12}$) = (1, 1, 1) and the data ($BRB_{10}$, $BRB_{11}$, $BRB_{12}$) = (0, 0, 0) from redundancy bit circuits $RBC_0$, $RBC_1$, $RBC_2$. Thus, NAND gate $NAND_8$ produces output signal $P_{18}$ of "0," and inverter $INV_8$ produces output signal $q_{18}$ of "1." On the other hand, NAND gates $NAND_1$-$NAND_7$ produce respective output signals $P_{11}$-$P_{17}$ of "1," and inverters $INV_1$-$INV_7$ produce respective output signals $q_{11}$-$q_{17}$ of "0".

Switch $SW_1$ is arranged to transfer output signal $S_{out1}$ as its output signal $D_{out1}$ when output signal $P_{11}$ is "1" and output signal $q_{11}$ is "0," and to transfer output signal $S_{outR}$ as its output signal $D_{out1}$ when output signal $P_{11}$ is "0" and output signal $q_{11}$ is "1". Switches $SW_2$-$SW_8$ are also similarly arranged. At this time, therefore, switch $SW_8$ transfers output signal $S_{outR}$, which represents the data stored in a memory cell connected to digit line $D_{1R1}$ in redundant memory cell matrix $MX_{1R}$ as its output signal $D_{out8}$. Switches $SW_1$-$SW_7$ transfer output signals $S_{out1}$-$S_{out7}$, which represent the data stored in the memory cells in the main memory cell matrices as their output signals $D_{out1}$-$D_{out7}$, respectively.

The gates of the NE-MOSFETs connected to data bus $SC_R$ shown in FIG. 2 are controlled such that the data to be written in the memory cell which is to be replaced will be supplied to the memory cell in the redundant memory cell matrix.

The circuit arrangement shown in FIG. 3 is required to replace a digit line in a main memory cell matrix with a digit line in a redundant memory cell matrix in one sector. If the flash EEPROM is composed of 16 memory cell sectors, it requires 16 control circuits $RED_{11}$ shown in FIG. 3. The total number of fuses required is 113 (7 fuses of $RAC_0$-$RAC_3$, $RBC_0$-$RBC_2 \times 16$ sectors + 1 fuse of RSC). Therefore, as the flash EEPROM increases in storage capacity and number of sectors, the number of fuses required increases, and the number of control circuit arrangements for switching between data read from the memory cells in the main memory cell matrices and data read from the memory cells in the redundant memory cell matrices, resulting in a larger flash EEPROM chip.

As described above, the conventional flash EEPROM composed of erasable memory cell sectors includes redundant memory cell matrices for the purpose of increasing the yield of flash EEPROMs, and each of the memory cell sectors has a redundant memory cell matrix including a digit line to replace a digit line connected to a memory cell that is unable to erase or read data. As a consequence, in the conventional flash EEPROM:

(1) each memory cell sector requires fuses to store data indicative of which output bit a substituted digit line is to be assigned to, and a logic circuit for decoding the stored data; and (2) since a relatively large number of fuses are employed, a relatively long period of time is needed for the fuses to write data in the procedure for checking the functions of the flash EEPROM.

For the above reasons, the conventional flash EEPROM has been disadvantageous in that it has an increased chip size and requires a long check time, and hence, results in an increased manufacturing cost.

SUMMARY OF THE INVENTION

It is an object of the present invention to provide a semiconductor memory device which has a smaller circuit arrangement required to replace a memory cell in a main memory cell matrix with a memory cell in a redundant memory cell matrix, and which has a smaller number of fuses for storing a memory cell sector in which to replace a memory cell and fuses for storing the number of an output bit which data read from the redundant memory cell matrix is to be assigned to.

According to the present invention, there is provided a nonvolatile semiconductor memory device comprising a plurality of sectors each comprising a plurality of main memory cell regions each composed of a matrix of nonvolatile memory cells, control means for writing data in, erasing data from, and reading data from the nonvolatile memory cells in each of the sectors, at least one redundant memory cell region composed of a matrix of nonvolatile memory cells, and replacing means for replacing one of the nonvolatile memory cells in any one of the sectors selected by addressing and found to be defective with one of the nonvolatile memory cells within that at least one redundant memory cell region.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
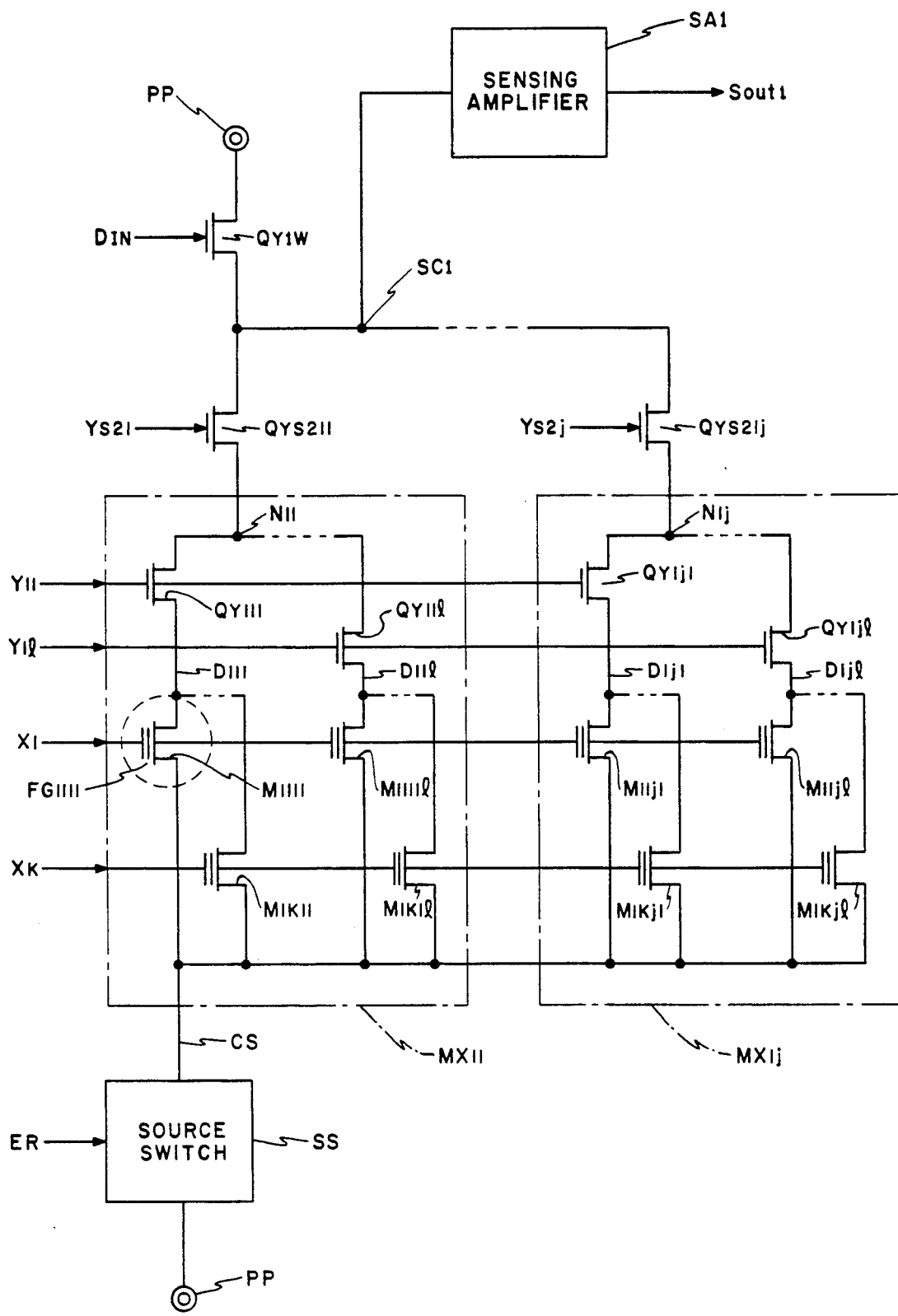
FIG. 1 is a circuit diagram, partly in block form, of a conventional semiconductor memory device.
Figure 2:
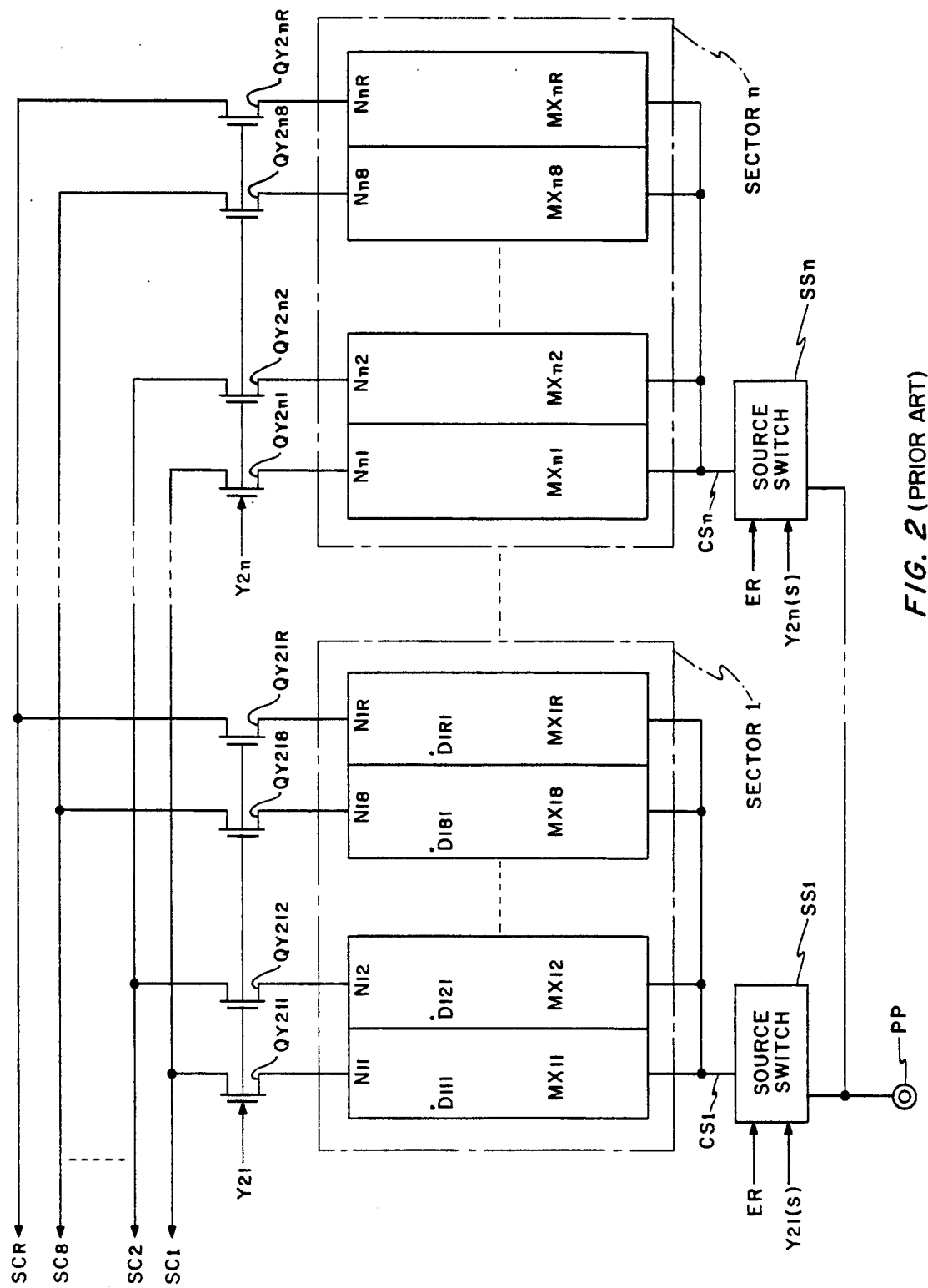
FIG. 2 is a block diagram of a conventional flash EEPROM.
Figure 4:
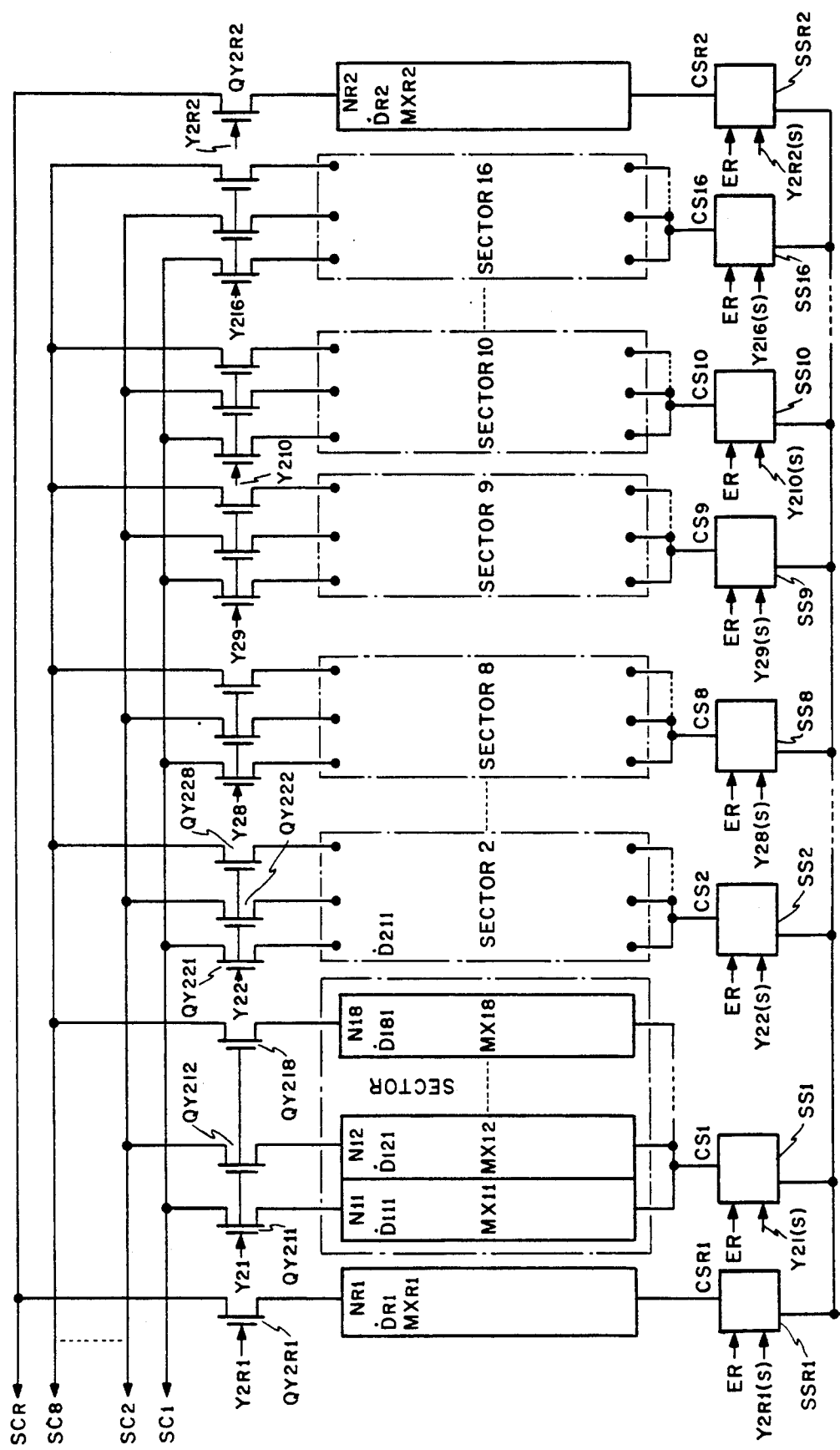
FIG. 4 is a block diagram of semiconductor memory device in the form of a flash EEPROM according to a first embodiment of the present invention.

As shown in FIG. 4, a semiconductor device according to a first embodiment is in the form of an 8-bit-output flash EEPROM composed of 16 memory cell sectors each erasable in its entirety at one time. Each of the memory cell sectors comprises a plurality of memory cell regions or matrices. Parts shown in FIG. 4 which are identical to those shown in FIG. 2 are denoted by identical reference characters, and will not be described in detail below.

In FIG. 4, the flash EEPROM has first and second redundant memory cell matrices $MX_{R1}$ and $MX_{R2}$ which can be selected respectively by sector selection lines $Y_{2R1}$ and $Y_{2R2}$. As with sector selection lines $Y_{21}$, ..., $Y_{216}$, in write mode, a voltage of 12 V is applied to sector selection lines $Y_{2R1}$ and $Y_{2Rn}$ when redundant memory cell matrices $MX_{R1}$ and $MX_{R2}$ are selected, and a voltage of 0 V is applied to sector selection lines $Y_{2R1}$ and $Y_{2Rn}$ when redundant memory cell matrices $MX_{R1}$ and $MX_{R2}$ are not selected, as indicated in the above table at $Y_{S21}$. In erase mode, a voltage of 0 V is applied sector selection lines $Y_{2R1}$ and $Y_{2Rn}$. In read mode, a voltage of 5 V is applied to sector selection lines $Y_{2R1}$, $Y_{2Rn}$ when redundant memory cell matrices $MX_{R1}$, $MX_{R2}$ are selected, and a voltage of 0 V is applied to sector selection lines $Y_{2R1}$ and $Y_{2Rn}$ when redundant memory cell matrices $MX_{R1}$ and $MX_{R2}$ are not selected. Sector-selecting NE-MOSFETs $Q_{Y2R1}$ and $Q_{Y2R2}$ control the selective connection of output nodes $N_{R1}$ and $N_{R2}$ of redundant memory cell matrices $MX_{R1}$ and $MX_{R2}$ to redundancy data bus $SC_R$. Source switches $SS_{R1}$ and $SS_{R2}$ are connected respectively to the first and second redundant memory cell matrices $MX_{R1}$ and $MX_{R2}$. More specifically, source switches $SS_{R1}$ and $SS_{R2}$ have respective output terminals CSR1 and CSR2 connected to the sources of all of the memory cells in first and second redundant memory cell matrices $MX_{R1}$ and $MX_{R2}$. Source switch $SS_{R1}$ can be controlled by a source switch selection line $Y_{2R1(S)}$ and the signal line ER. Likewise, source switch $SS_{R2}$ can be controlled by a source switch selection line $Y_{2R2(S)}$ and the signal line ER.

The first redundant memory cell matrix $MX_{R1}$ operates as a common redundant memory cell matrix for memory cell sectors 1-8, and the second redundant memory cell matrix $MX_{R2}$ operates as a common redundant memory cell matrix for memory cell sectors 9-16. Basically, the flash EEPROM according to the first embodiment differs from the conventional flash EEPROM shown in FIG. 2 with respect to the provision of the first and second redundant memory cell matrices, $MX_{R1}$ and $MX_{R2}$, and the associated circuits and components, as described above.

It is assumed that the flash EEPROM shown in FIG. 4 contains a memory cell connected to digit line $D_{181}$ in memory cell matrix $MX_{18}$ in memory cell sector 1, and that memory cell is unable to write, erase, or read and data. A process for replacing digit line $D_{181}$ connected to the fault memory cell with a digit line $D_{R1}$ in the first redundant memory cell matrix, $MX_{R1}$, will be described below.

Figure 5:
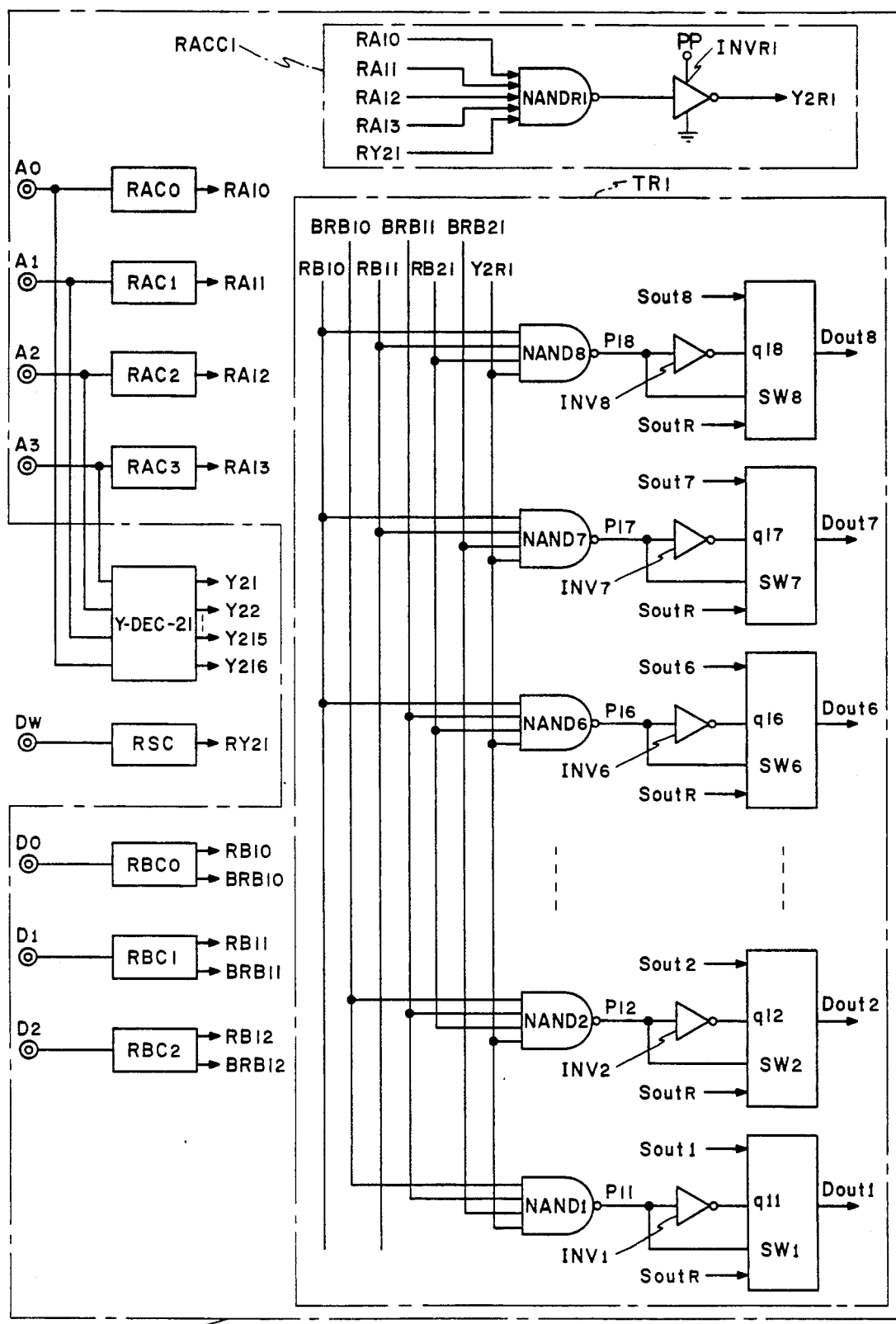
FIG. 5 is a block diagram of a control circuit in the flash EEPROM shown in FIG. 4, for replacing a digit line in a main memory cell matrix with a digit line in a redundant memory cell matrix.

FIG. 5 shows control circuit $RED_1$ for replacing digit lines in the respective main memory cell matrices in memory cell sectors 1-8 with a digit line in the first redundant memory cell matrix, $MX_{R1}$. Parts shown in FIG. 5 which are identical to those shown in FIG. 3 are denoted by identical reference characters and will not be described in detail below.

Control circuit $RED_1$ has address input terminals $A_0$, $A_1$, $A_2$, $A_3$ which are supplied with addresses to decode sector selection lines $Y_{21}$, ..., $Y_{216}$ shown in FIG. 4. A sector selection decoder Y-DEC-21 is supplied with the address data from address input terminals $A_0$, $A_1$, $A_2$, $A_3$. Redundancy address circuits $RAC_0$, $RAC_1$, $RAC_2$, $RAC_3$ each have internal fuses for storing the address of a sector to be replaced. Redundancy address circuits $RAC_0$, $RAC_1$, $RAC_2$, and $RAC_3$ produce respective output signals $RA_{10}$, $RA_{11}$, $RA_{12}$, and $RA_{13}$ when the supplied address data agrees with the stored address data in write and read modes. A redundancy selection circuit RSC has an internal fuse which is selectively melted by a control signal from an external terminal $D_W$ to store data indicative of whether the flash EEPROM uses a redundancy memory cell matrix or not. When a redundancy memory cell matrix is used, the redundancy selection circuit RSC produces an output signal $RY_{21}$ of "1".

Figure 3:
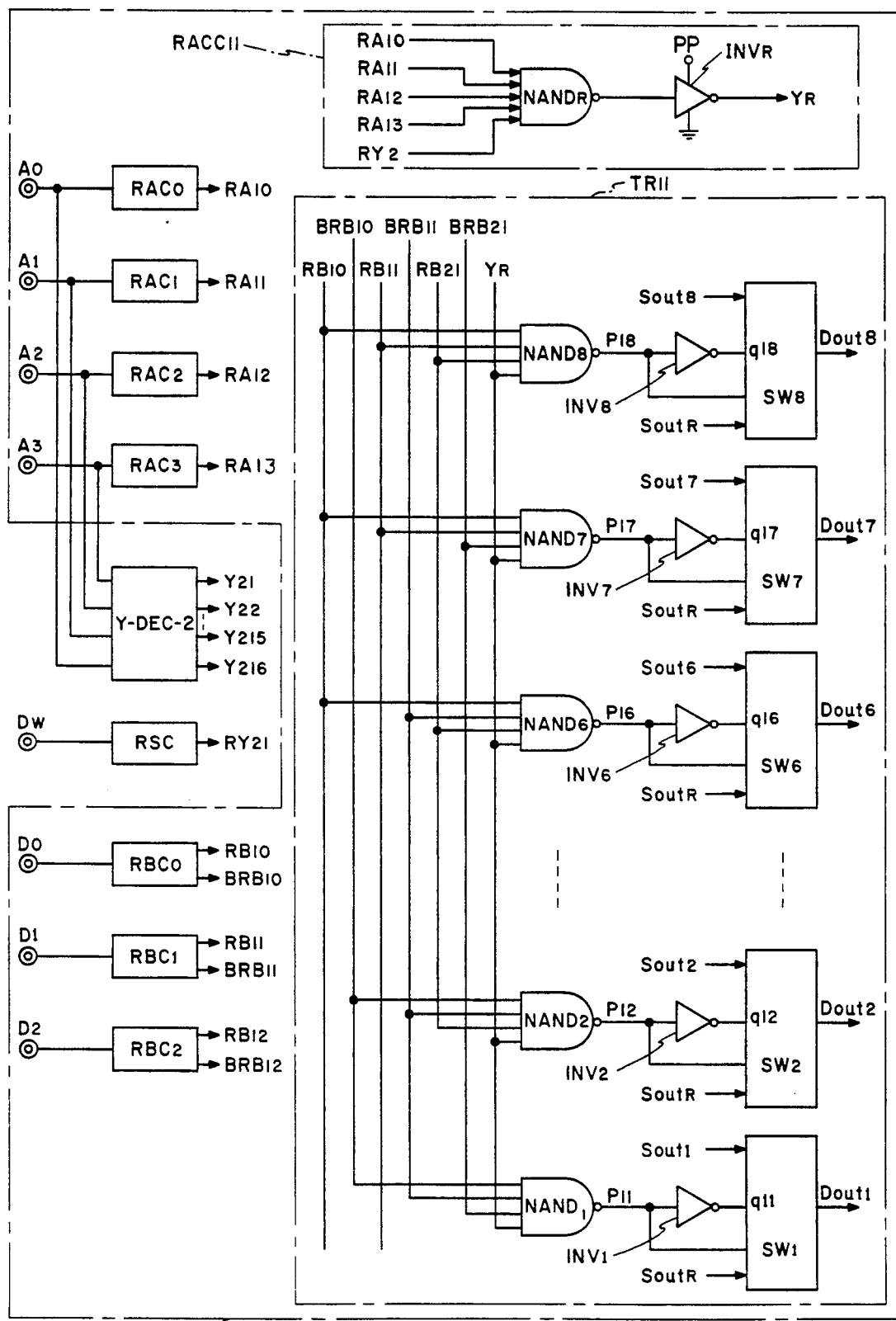
FIG. 3 is a block diagram of a control circuit in the flash EEPROM shown in FIG. 2 for replacing a digit line in a main memory cell matrix with a digit line in a redundant memory cell matrix.

As with input terminals $D_0$, $D_1$, and $D_2$ shown in FIG. 3, input terminals $D_0$, $D_1$, and $D_2$ supply control signals respectively to redundancy bit circuits $RBC_0$, $RBC_1$, and $RBC_2$ that each have fuses that are selectively melted by the supplied control signals to store data indicative of which output bit the substituted digit line is to be assigned to.

A redundancy access circuit $RACC_1$ produces an output signal $Y_{2R1}$ of 5 V in read mode and an output signal $Y_{2R1}$ of 12 V in write mode when the address data supplied from input terminals $A_0$, $A_1$, $A_2$, and $A_3$ agrees with the address data stored in redundancy address circuits $RAC_0$, $RAC_1$, $RAC_2$, and $RAC_3$. Redundancy access circuit $RACC_1$ produces an output signal $Y_{2R1}$ of 0 V when any one of the output data $RA_{10}$–$RA_{13}$, and $RY_{21}$ is "0". Redundancy access circuit $RACC_1$ comprises NAND gate $NAND_{R1}$ and inverter $INV_{R1}$. Output signal $Y_{2R1}$ is supplied to sector selection line $Y_{2R1}$ shown in FIG. 4 to control the gate of NE-MOSFET $QY_{2R1}$.

Control circuit $RED_1$ also has control circuit $TR_1$ which controls the transfer of output data $S_{outR}$ of the sensing amplifier that has read a memory cell in first redundant memory cell matrix $MX_{R1}$ to one of output signals $D_{out1}$–$D_{out8}$, as with control circuit $TR_{11}$ shown in FIG. 3. Output signals $D_{out1}$–$D_{out8}$ are supplied to the input terminals of respective output buffers (not shown).

As described above, digit line $D_{181}$ in memory cell matrix $MX_{18}$ in memory sector 1 is assumed to be replaced with digit line $D_{R1}$ in first redundant memory cell matrix $MX_{R1}$. In a procedure for checking the functions of the flash EEPROM, the address of sector 1 is written by the fuses of redundancy address circuits $RAC_0$ through $RAC_3$. For example, if the data stored by the fuses of redundancy address circuits $RAC_0$, $RAC_1$, $RAC_2$, and $RAC_3$ are indicated respectively by $RAC_{f0}$, $RAC_{f1}$, $RAC_{f2}$, and $RAC_{f3}$, this stored data is represented by $(RAC_{f0}, RAC_{f1}, RAC_{f2}, RAC_{f3}) = (0, 0, 0, 0)$. The fuse of redundancy selection circuit RSC stores data and produces an output signal $RY_{21}$ of "1".

The data indicating an output bit 8 is stored by the fuses of redundancy bit circuits $RBC_0$, $RBC_1$, and $RBC_2$. Thus, redundancy bit circuits $RBC_0$, $RBC_1$, and $RBC_2$ store data $(RB_{10}, RB_{11}, RB_{12}) = (1, 1, 1)$ and inverted data $(BRB_{10}, BRB_{11}, BRB_{12}) = (0, 0, 0)$, respectively.

With the data being thus stored by the fuses in control circuit $RED_1$, when sector 1 is selected, the flash EEPROM operates in write, erase, and read modes as follows, depending on whether the supplied address data corresponds or not to a digit line to be replaced.

1. Write mode (1) When the supplied address data does not correspond to a digit line to be replaced, the nodes shown in FIG. 4 are controlled as indicated above in the table, and supplied data is stored in a memory cell indicated by the supplied address data in a main memory cell matrix. For details, reference should be made to the foregoing description with reference to FIGS. 2 and 3.

(2) When the supplied address data corresponds to a digit line to be replaced, a voltage of 12 V is applied to both sector selection lines, $Y_{21}$ and $Y_{2R1}$, rendering NE-MOSFETs $Q_{Y2R1}$, $Q_{Y211}$, ..., $Q_{Y218}$ conductive. Since an output bit to be replaced is an output bit 8, the same data as the data supplied to data bus $SC_8$ is supplied to data bus $SC_R$. For example, when a memory cell connected to digit line $D_{181}$ is selected and data is to be written in the selected memory cell, a voltage of (Vpp−VTN) is applied to data bus $SC_8$. At this time, the voltage of (Vpp−VTN) is applied to data bus $SC_R$. Therefore, a voltage of (Vpp−VTN) is applied to digit line $D_{R1}$ in redundant memory cell matrix $MX_{R1}$, and the data is stored in the memory cell which is selected by a column address line. Source switch $SS_{R1}$ applies an output signal $CSR_2$ of 0 V.

2. Sector erase mode (1) For erasing sectors other than sector 1, a voltage of 12 V is applied to terminal PP, and a voltage of 0 V is applied to all of the column address lines. To erase sector 2, a voltage of 0 V is applied to sector selection line $Y_{22}$. At the same time, source switch selection line $Y_{22(S)}$ is supplied with a signal "1", activating source switch $SS_2$. Source switch $SS_2$ produces an output signal of 12 V, thereby erasing all of the memory cells in sector 2.

(2) To erase sector 1, source switch selection lines $Y_{21(S)}$ and $Y_{2R1(S)}$ are supplied with a signal "1", activating source switches $SS_1$ and $SS_{R1}$. Source switches $SS_1$ and $SS_{R1}$ produce an output signal of 12 V. A voltage of 0 V is imposed on sector selection line $Y_{21}$ and sector selection line $Y_{2R1}$ to select first redundant memory cell matrix $MX_{R1}$. Therefore, all of the memory cells in sector 1 and all of the memory cells in first redundant memory cell matrix $MX_{R1}$ are erased. The net result is that the memory cells in first redundant memory cell matrix $MX_{R1}$ are controlled as if they were contained in sector 1.

3. Read mode (1) When a memory cell is selected that is connected to a digit line other than $D_{181}$, the digit line to be replaced, a voltage of 5 V is applied to terminal PP, and a voltage of 5 V is applied to the selected column address line and the selected sector selection line. The output signal from the selected memory cell matrix is supplied to the corresponding data bus, reading the data from the selected memory cell in the manner described with reference to the prior art.

(2) When a memory cell is selected that is connected to digit line $D_{181}$ that is to be replaced, since the stored data is established such that $(RA_{10}, RA_{11}, RA_{12}, RA_{13})=(1, 1, 1, 1)$, $(RY_{21})=(1)$, $(RB_{10}, RB_{11}, RB_{12})=(1, 1, 1)$, and $(BRB_{10}, BRB_{11}, BRB_{12})=(0, 0, 0)$, redundancy access circuit $RACC_1$ produces an output signal $Y_{2R1}$ of 5 V. In control circuit $TR_1$, NAND gate $NAND_8$ produces an output signal $P_{18}$ of "0," inverter $INV_8$ produces an output signal $q_{18}$ of "1," NAND gates $NAND_1$-$NAND_8$ each produce output signals $P_1$-$P_{17}$ of "1," and inverters $InV_1$-$INV_{17}$ each produce output signals $q_1$-$q_{17}$ of "0." Therefore, control circuit $TR_1$ transfers the data $S_{out1}$-$S_{out7}$ to output signals $D_{out1}$-$D_{out7}$ and also transfers the data $S_{outR}$ to output signal $S_{out8}$.

Since NE-MOSFET $Q_{Y2R1}$ shown in FIG. 4 is rendered conductive at this time, the data stored in the memory cell that is connected to digit line $D_{R1}$ and selected by the column address line appears on redundancy memory cell data bus $SC_R$. The sensing amplifier coupled to data bus $SC_R$ then reads the data stored in the memory cell, and output signal $S_{outR}$ is delivered as output signal $D_{out8}$, replacing output signal $S_{out8}$.

In the above example, a memory cell connected to digit line $D_{181}$ in sector 1 is replaced with a memory cell connected to digit line $D_{R1}$ in first redundant memory cell matrix $MX_{R1}$, and the data from the substituted memory cell is assigned to an output bit 8. However, the fuses of redundancy address circuits $RAC_0$, $RAC_1$, $RAC_2$, and $RAC_3$ may be selectively melted to store data representing any sector ranging from sectors 1 to 8, and the fuses of redundancy bit circuits $RBC_0$, $RBC_1$, and $RBC_2$ may be selectively melted to store data indicative of any bit ranging from output bits 1 to 8 which the data stored in the substituted memory cell is to be assigned to.

The circuit arrangement shown in FIG. 5 is required to replace a digit line in a sector ranging from sectors 1 to 8 with a digit line in first redundant memory cell matrix $MX_{R1}$. The flash EEPROM shown in FIG. 4 also requires a circuit for replacing a digit line in a sector ranging from sectors 9 to 16 with a digit line in a second redundant memory cell matrix $MX_{R2}$. Consequently, the flash EEPROM shown in FIG. 4 needs two control circuits $RED_1$ and a redundancy selection circuit RSC, shown in FIG. 5. The overall circuit arrangement for replacing digit lines connected to defective memory cells in the main memory cell matrices with digit lines in the redundancy memory cell matrices is much smaller in scale than the conventional circuit arrangement shown in FIG. 2. The total number of fuses required is 15 (7 fuses of $RAC_0$-$RAC_3$, $RBC_0$-$RBC_2 \times 2$ control circuits $RED_1$ +1 fuse of RSC), which is far less than the total number of fuses used in the conventional flash EEPROM.

Figure 6:
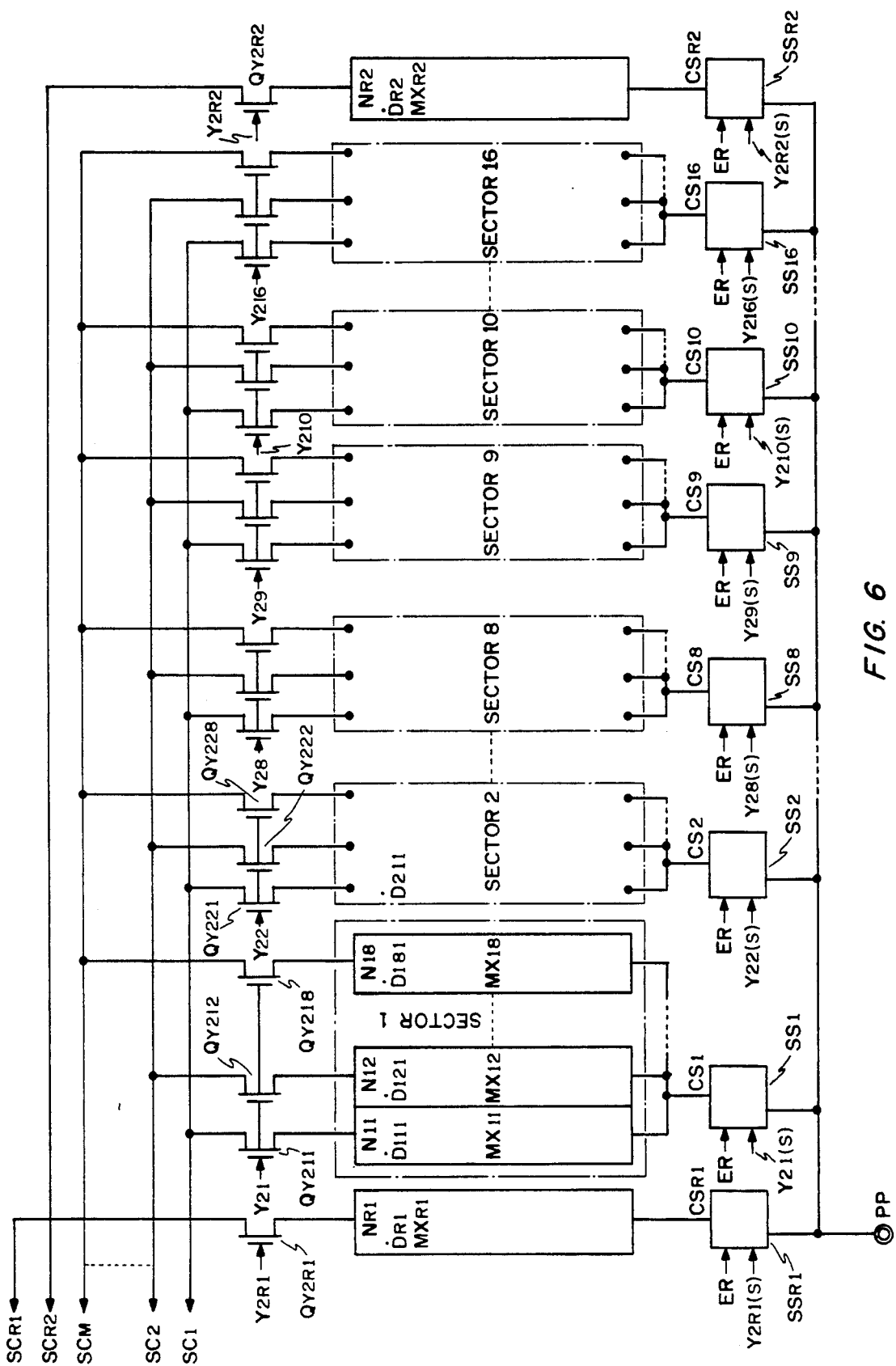
FIG. 6 is a block diagram of a semiconductor memory device in the form of a flash EEPROM according to a second embodiment of the present invention.

FIG. 6 shows a flash EEPROM according to a second embodiment of the present invention. Parts shown in FIG. 6 which are identical to those shown in FIG. 4 are denoted by the same reference characters and will not be described in detail below.

The control circuit means for the second embodiment (FIG. 6) is similar to the control circuit means shown in FIG. 5 for the first embodiment (FIG. 4), except that while a switch $SW_1$ among the switches $SW_1$-$SW_8$ in the first embodiment (FIG. 4) outputs a signal $Sout_1$ or $Sout_R$ on output $Dout_1$, a switch $SW_1$ of switches $SW_1$-$SW_8$ in the second embodiment (FIG. 6) outputs any one of the signals $Sout_1$, $Sout_{R1}$ and $Sout_{R2}$ on output $Dout_1$. Other construction details of the control circuit means in the second embodiment (FIG. 6) are the same as the control circuit means shown in FIG. 5.

The flash EEPROM shown in FIG. 6 differs from the flash EEPROM shown in FIG. 4 in that first and second redundancy memory cell matrices $MX_{R1}$ and $MX_{R2}$ are associated with redundancy memory cell data buses $SC_{R1}$ and $SC_{R2}$, respectively. NE-MOSFETs $Q_{Y2R1}$ and $Q_{Y2R2}$ for writing data and the sensing amplifier are connected to redundancy memory cell data buses $SC_{R1}$ and $SC_{R2}$. In the first embodiment, it is impossible to simultaneously replace memory cells in two sectors among sectors 1 through 8 which fail to write, erase, or read data. For example, a memory cell connected to digit line $D_{111}$ and a memory cell connected to digit line $D_{211}$ cannot be simultaneously replaced with memory cells in the redundant memory cell matrix. According to the second embodiment, however, since first and second redundancy memory cell matrices $MX_{R1}$ and $MX_{R2}$ are associated with redundancy memory cell data buses $SC_{R1}$ and $SC_{R2}$, respectively, digit lines $D_{111}$ and $D_{211}$, for example, may be replaced with digit lines $D_{R1}$ and $D_{R2}$, respectively, in first and second redundancy memory cell matrices $MX_{R1}$ and $MX_{R2}$. As a consequence, defective memory cells can be remedied more successfully in the flash EEPROM according to the second embodiment than in the flash EEPROM according to the first embodiment.

The control circuit arrangement required to replace memory cells in the main memory cell matrices with memory cells in the redundant memory cell matrices according to the second embodiment is more complex than the control circuit arrangement shown in FIG. 5 according to the first embodiment. Specifically, it is necessary for the control circuit arrangement according to the second embodiment to effect a control process to determine which data read from a memory cell in the first or second redundancy memory cell matrix is to replace the data in a defective memory cell in the main memory cell matrix. Such a control process will not be described below as it can be readily understood from FIG. 5.

Although certain preferred embodiments of the present invention have been shown and described in detail, it should be understood that various changes and modifications may be made therein without departing from the scope of the appended claims.

What is claimed is:

1. A nonvolatile semiconductor memory device comprising:
   a plurality of sectors each comprising a plurality of main memory cell regions each composed of a matrix of nonvolatile memory cells;
   control means for writing data in, erasing data from, and reading data from said nonvolatile memory cells in each of said sectors;
   at least one redundant memory cell region composed of a matrix of nonvolatile memory cells;
   replacing means for replacing any one of said nonvolatile memory cells which is selected by addressing in any one of said sectors and when the addressed cell is found to be defective, said replacing being with one of the nonvolatile memory cells and in said at least one redundant memory cell region; and
   voltages of sources of memory cells constituting each sector being controlled and driven by a circuit means;
   sources of memory cells in said redundant memory cell regions being controlled and driven by an independent circuit means which is other than said circuit means which controls and drives the voltages of the sources of memory cells constituting each sector.

2. A nonvolatile semiconductor memory device according to claim 1, wherein said nonvolatile memory cells in said at least one redundant memory cell region are structurally and characteristically identical to said nonvolatile memory cells in said main memory cell regions.

3. A nonvolatile semiconductor memory device according to claim 1, wherein said sectors are divided into a plurality of groups, and said at least one redundant memory cell region being a plurality of redundant memory cell regions each composed of a matrix of nonvolatile memory cells, said redundant memory cell regions being associated with said groups, respectively, of said sectors, said replacing means comprising means for replacing the defective and selected nonvolatile memory cell with the nonvolatile memory cell in a redundant memory cell region which is associated with a group of the sector which contains said defective and selected nonvolatile memory cell.

4. A nonvolatile semiconductor memory device according to claim 3, wherein said replacing means comprises means for replacing the defective and selected nonvolatile memory cell with one of the nonvolatile memory cells in any one of the redundant memory cell regions which is associated with another one of said groups of the sectors other than the group that contains the defective and selected nonvolatile memory cell.

5. A nonvolatile semiconductor memory device according to claim 1, wherein said replacing means comprises means for replacing a digit line connected to a drain of the defective and selected nonvolatile memory cell with a digit line connected to a drain of the nonvolatile memory cell in said at least one redundant memory cell region.

6. A nonvolatile semiconductor memory device according to claim 1, further including:
   k column address lines,
   l row address lines,
   m data buses,
   n sector selection lines,
   a redundant memory cell region selection line, and
   a redundant memory cell data bus,
   wherein said nonvolatile memory cells of said main memory cell regions of each sector have drains connected to digit lines, gates connected to said row address lines, and sources connected in common to a respective source terminal of each sector, said main memory cell regions include column address selecting transistors connected between said digit lines and output nodes of the memory cell regions, said column address selecting transistors having gates for respective column address lines;
   said nonvolatile semiconductor memory device further including sector selecting transistors connected respectively between said output nodes and data buses corresponding to said output mode and having respective gates connected to respective said sector selection lines;
   wherein said nonvolatile memory cells of said redundant memory cell region have drains connected to redundant memory cell digit line, gates connected to said row address lines, and sources connected in common to a source terminal other than said source terminals of the sectors, said redundant memory cell region including column address selecting transistors connected between said redundant memory cell digit line and an output node of the redundant memory cell region and said column address selecting transistors having gates connected respectively to column address lines; and
   further including a redundant memory cell region selecting transistor connected between said output node of the redundant memory cell region and said redundant memory cell data bus and having a gate connected to said redundant memory cell region selection line.

7. A nonvolatile semiconductor memory device according to claim 1, wherein said replacing means comprises:
   redundancy address circuits having fuses for storing address data of one of the sectors which contains the defective and selected nonvolatile memory cell to be replaced, said redundancy address circuits comprising means for supplying address data to decode sector selection lines and detecting whether the supplied address data agrees with stored address data in write and read modes;

redundancy bit circuits having fuses for storing data indicative of which output bit the nonvolatile memory cell in the redundant memory cell region to replace the defective and selective nonvolatile memory cell is to be assigned to;

a redundancy access circuit for selectively applying predetermined voltages respectively in read mode and write mode to a line for selecting the nonvolatile memory cell in the redundant memory cell region which is to replace the defective and selected nonvolatile memory cell when the supplied address data agrees with stored address data in said redundancy address circuits; and a control circuit for transferring stored data read from the nonvolatile memory cell in the redundant memory cell region to replace the defective and selected nonvolatile memory cell to an output buffer circuit corresponding to said output bit whose data is stored by said redundancy bit circuits.

* * * * *